United States Patent [19]

Neumann et al.

[11] Patent Number: 5,534,715
[45] Date of Patent: Jul. 9, 1996

[54] JOSEPHSON JUNCTION IN A WIRING PATTERN OF A SUPERCONDUCTOR OXIDE

[75] Inventors: Christian Neumann, Karlsruhe, Germany; Katsumi Suzuki, Kodaira, Japan; Youichi Enomoto; Shoji Tanaka, both of Tokyo, all of Japan

[73] Assignees: International Superconductivity Technology Center; NEC Corporation, both of Japan

[21] Appl. No.: 148,277

[22] Filed: Nov. 8, 1993

[30] Foreign Application Priority Data

Nov. 10, 1992 [JP] Japan .................................. 4-299450

[51] Int. Cl.⁶ ............................................... H01L 39/22
[52] U.S. Cl. ............................... 257/33; 257/34; 505/191
[58] Field of Search ............................... 257/33, 34, 31, 257/32, 36; 505/190, 191, 193

[56] References Cited

U.S. PATENT DOCUMENTS

| 5,077,266 | 12/1991 | Takagi et al. .................. 505/1 |
| 5,179,426 | 1/1993 | Iwamatsu .................... 505/1 |

FOREIGN PATENT DOCUMENTS

| 0329603 | 8/1989 | European Pat. Off. ................. 257/33 |
| 0325765 | 8/1989 | European Pat. Off. ................. 257/33 |
| 0364101 | 4/1990 | European Pat. Off. .................. 257/3 |
| 1-11376 | 1/1989 | Japan ........................................ 257/33 |

OTHER PUBLICATIONS

Physical Review letters; vol. 64, No. 2, 8 Jan. 1990, pp. 228–230.
Appl. Phys. Lett. 58(5) 4 Feb. 1991, pp. 543–545.

Primary Examiner—Donald L. Monin, Jr.
Attorney, Agent, or Firm—Lorusso & Loud

[57] ABSTRACT

A Josephson junction is disclosed which includes a substrate of a single crystal having a substantially flat surface, a wiring pattern of an oxide superconductor formed on the flat surface of the substrate, and an altered region formed having a width of 300 nm or less and formed in the wiring pattern to intersect the wiring pattern, the crystal orientations of the wiring pattern on both sides of the altered region being equal to each other. The Josephson junction may be prepared by a process including the steps of: (a) coating a surface of a substrate of a single crystal with a normal metal to form a protecting layer over the surface of the substrate; (b) irradiating a predetermined portion of the protecting layer with a focused ion beam so that an irradiated portion is formed in the substrate; (c) removing the protecting layer from the substrate; and (d) forming a wiring pattern of an oxide superconductor on the surface of the substrate from which the protecting layer has been removed such that the wiring pattern crosses the irradiated portion of the substrate, thereby forming an altered portion in the wiring pattern at a position above the irradiated portion.

4 Claims, 4 Drawing Sheets

F I G. 5
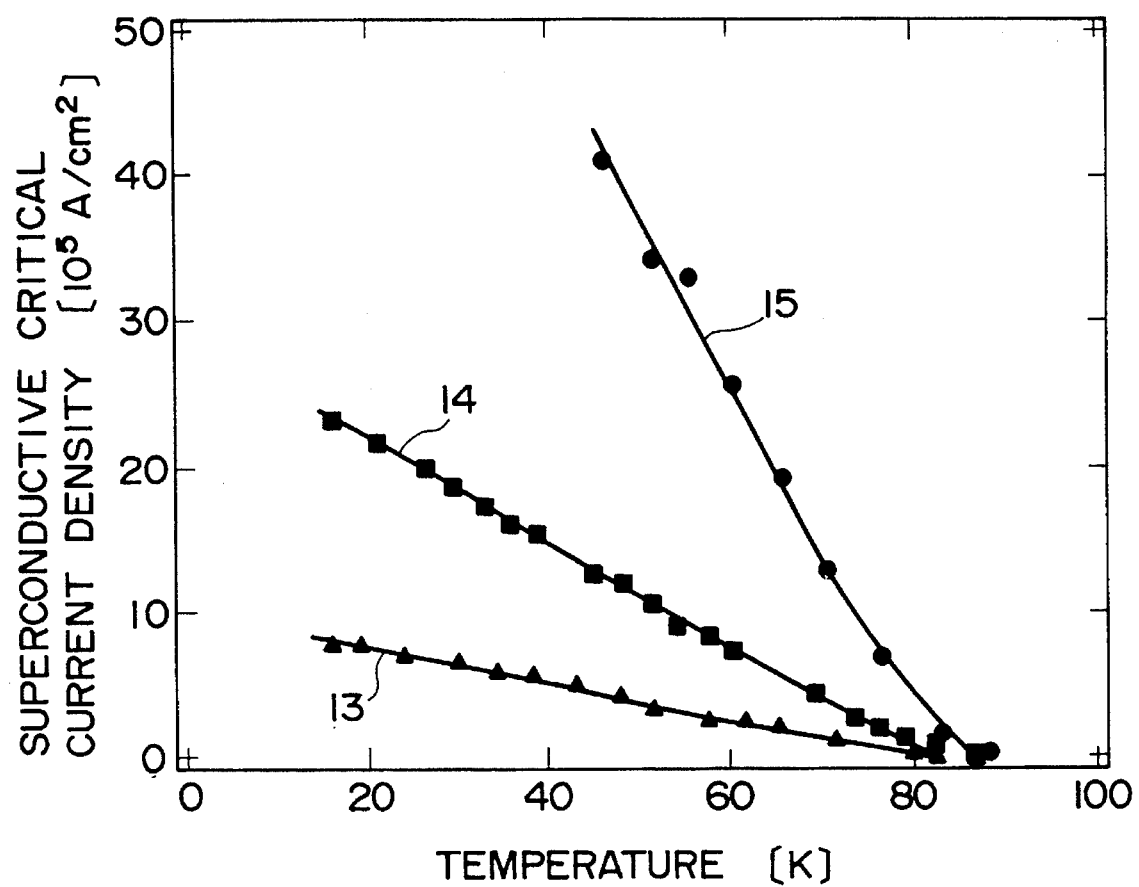

JOSEPHSON JUNCTION IN A WIRING PATTERN OF A SUPERCONDUCTOR OXIDE

BACKGROUND OF THE INVENTION

1. Field of the Invention

This invention relates to a Josephson junction and to a process for the production thereof.

1. Prior Art

In application of superconductors to electronic devices, it is very important to produce Josephson junctions with a large IcRn product. Because high Tc oxide superconductors have layered crystal structures and short coherent lengths, it is very difficult to produce Josephson junctions of a laminate type. Thus, the recent trend in the fabrication of Josephson junctions is toward the formation of grain boundary on a substrate.

Gross, R. et al propose the use of a substrate which is a laminate of two single crystal layers (Phys. Rev. Lett., 64, 228 (1990)). Dary, K. et al propose the use of a substrate having a stepped portion (Appl. Phys. Lett., 58, 543 (1991)). These methods, which utilize the difference in crystal orientations of the superconductors on both sides of the link, are not satisfactory because of the poor reproducibility of the Josephson junction characteristics, a small IcRn product (below 0.3 mV) and difficulty in forming the link at a desired position.

Ghyselen, B. et al propose a YBaCuO/normal metal/YBaCuO junction produced with the use of a focused ion beam micromachining technique in which a 20 KeV Ga focused ion beam with a diameter of 50 nm is used to form a trench in YBaCuO line provided on a SrTiO$_3$ substrate. The resulting two superconducting electrodes separated from each other by the trench are then connected by deposition of the normal metal bridge (Physica C, 198, 215 (1992)).

A method is also known which comprises the steps of: irradiating a predetermined portion of a surface of a substrate of a MgO single crystal with a Ga focused ion beam to form a steep slope trench in the substrate; depositing YBaCuO superconductor on the surface of the substrate so that a tunnel barrier is formed in the YBaCuO layer; and patterning the YBaCuO superconductor layer to form a wiring pattern such that the tunnel barrier intersects the wiring pattern. In this method, a superconductor/normal metal/superconductor (SNS) structure is considered to be formed because the crystal orientation of the superconductor in the trench differs from that of the superconductor outside of the trench or because a grain boundary is formed on the trench. With this method, however, the reproducibility of the Josephson junction characteristics is not good and the IcRn product is as small as 0.3 mV.

SUMMARY OF THE INVENTION

The present invention has been made to provide a Josephson junction having a large IcRn product and a process of defining such a Josephson junction on any desired area on a substrate with good reproducibility and with a high degree of precision.

In accordance with one aspect of the present invention there is provided a Josephson junction comprising a substrate of a single crystal having a substantially flat surface, a wiring pattern of an oxide superconductor formed on said flat surface of said substrate, and an altered region having a width of 300 nm or less and intersecting said wiring pattern, the crystal orientations of said wiring pattern on both sides of said altered region being equal to each-other.

The average crystal orientation of the altered region is preferably equal to the crystal orientations of the wiring pattern on both sides of the altered region.

In another aspect, the present invention the present invention provides a process for the production of a Josephson junction, comprising the steps of:

(a) coating a surface of a substrate of a single crystal with a normal metal to form a protecting layer over the surface of said substrate;

(b) irradiating a predetermined portion of said protecting layer with a focused ion beam so that an irradiated portion is formed in said substrate;

(c) removing said protecting layer from said substrate; and (d) forming a wiring pattern of an oxide superconductor on the surface of said substrate from which said protecting layer has been removed such that said wiring pattern crosses said irradiated portion of said substrate, thereby forming an altered portion in said wiring pattern at a position above said irradiated portion.

Step (d) preferably includes the substeps of: depositing said oxide superconductor on the surface of said substrate from which said protecting layer has been removed to form a layer of said oxide superconductor and to form said altered portion in said oxide superconductor layer at a position above said irradiated portion; and patterning said oxide superconductor layer to form said wiring pattern such that said altered portion intersects said wiring pattern.

The present invention will now be described in detail below with reference to the accompanying drawings in which:

FIG. 1 is an enlarged plan view diagrammatically showing a Josephson junction according to the present invention;

FIGS. 2(a)–2(e) are sectional views explanatory of process steps for the fabrication of the Josephson junction of FIG. 1, FIG. 2(e) being a sectional view taken on line II—II in FIG. 1;

FIG. 5 is a graph showing temperature dependency of superconducting critical electric current density of Josephson junctions obtained in Example 1.

One preferred embodiment of the fabrication of a Josephson junction according to the present invention will now be described with reference to FIGS. 2(a)–2(e). The process uses a substrate 1 of a single crystal such as MgO, SrTiO$_3$, NdGaO$_3$, LaAlO$_3$ or LaGaO$_3$. If desired a mixed crystal of one or more of these single crystals may be used. It is important that the substrate 1 have a substantially flat surface. The term "substantially flat surface" used herein is intended to refer to such a surface that a superconductive layer provided thereon has crystal orientation substantially equal throughout that surface. Thus, the presence of small grooves or steps in a surface of the substrate 1 is permissive for the purpose of the present invention as long as the crystal orientation of a superconductor layer provided on that surface is substantially unvaried over the surface.

Figure 2A:
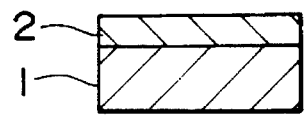

As shown in FIG. 2(a), the substrate 1 is first coated with a normal metal, such as Au, Pd or Pt, to form a protecting layer 2 over the flat surface thereof. The formation of the protecting layer 2 may be suitably performed by vacuum deposition. The protecting layer 2 generally has a thickness of 0.01–0.4 μm, preferably 0.02–0.2 μm.

Figure 2B:
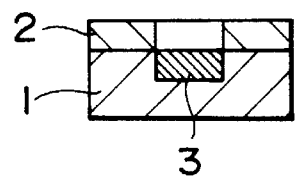

The coated substrate 1 is then irradiated with a focused ion beam at any desired position so that the irradiated portion of the protecting layer 2 is etched and removed and an irradiated portion 3 is defined in the substrate 1 at the desired position, as shown in FIG. 2(b). The irradiated portion 3 contains the implanted ion and serves to form an altered portion 5 in the superconductor layer 4 provided on the substrate 1 and the altered portion 5 in turn provides a link or junction of superconductor wiring pattern 4a, as described hereinafter.

The focused ion beam is preferably $Ga^+$ ion beam. The beam diameter is preferably in the range of 10–100 nm and the beam current is in the range of 1 pA–60 nA. Because of the presence of the protecting layer 2, the scattering of the ion can be minimized so that the width of the irradiated portion 3 can be maintained as small as 300 nm or less. The protecting layer 2 also serves to prevent the formation of a large trench in the substrate 1.

Figure 2C:
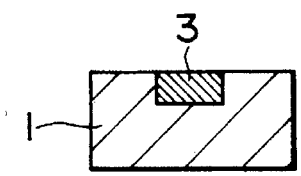

After the completion of the ion beam irradiation, the protecting layer 2 is completely removed from the substrate 1 as shown in FIG. 2(c). For this purpose, an argon ion milling method or a wet method using an aqueous solution containing KI and I is suitable for reasons of prevention of adverse affection on the substrate.

Figure 2D:
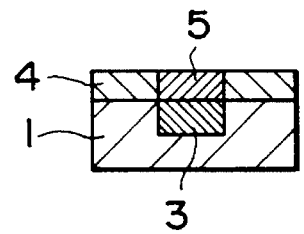

A layer 4 of an oxide superconductor is then formed on the surface of the substrate 1 from which the protecting layer 2 has been removed and which bears the irradiated portion 3 (FIG. 2(d)). As a result, an altered portion 5 is defined in the superconducting layer 4 at a position above the irradiated portion 4.

The oxide superconductor is preferably a YBaCuO superconductor, such as $YBa_2Cu_3O_{7-x}$ or $YBa_2Cu_4O_{8-x}$. The thickness of the superconductor layer 4 is generally in the range of 0.05–0.6 μm, preferably 0.1–0.4 μm. The formation of the superconductor layer 4 may be performed by a pulse laser deposition method, a magnetron sputtering method or like conventional method.

Figure 1:
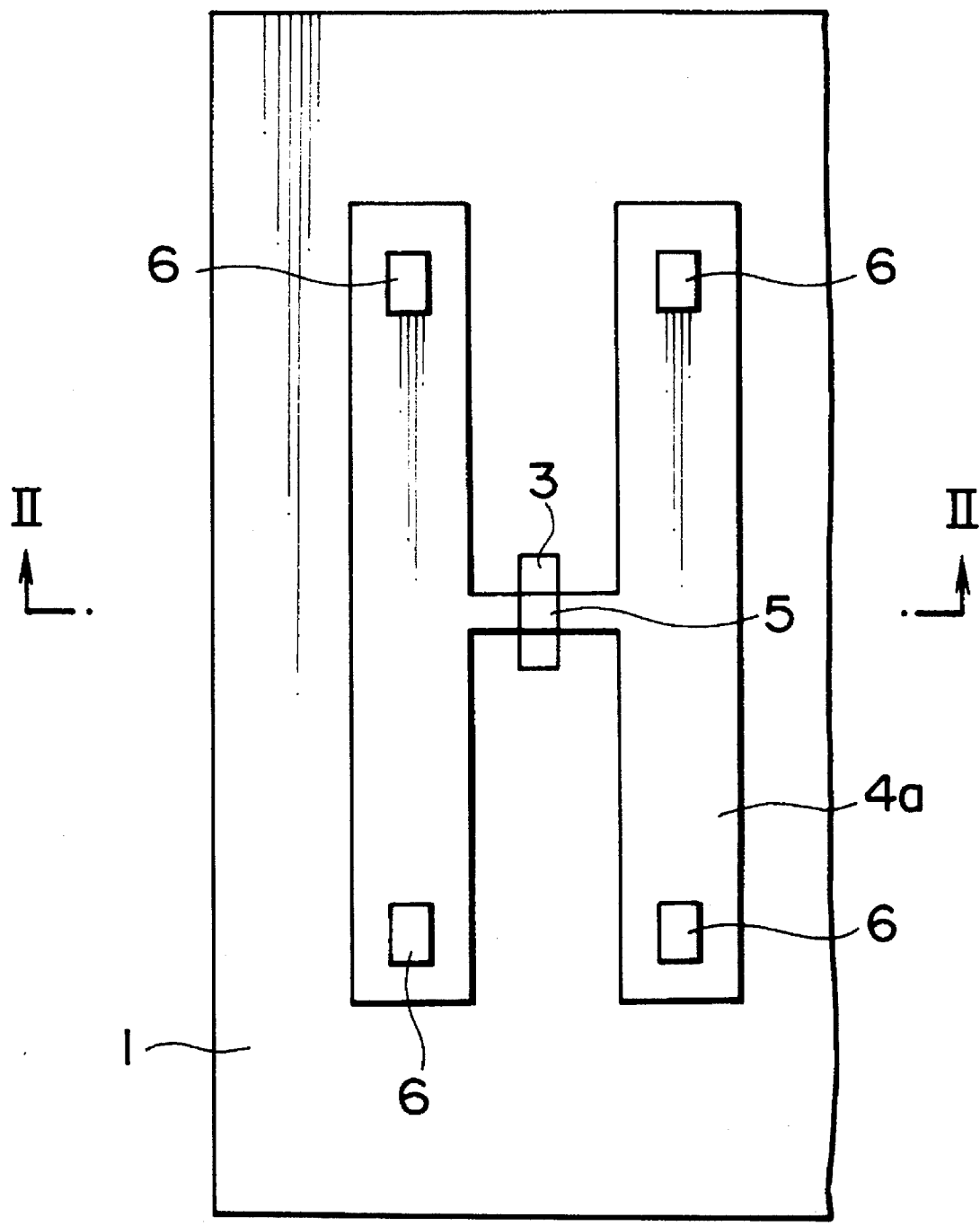
Figure 2E:
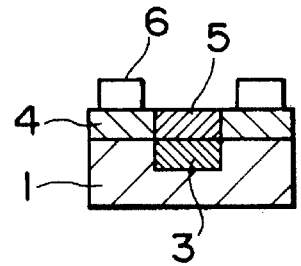

The superconductor layer 4 is thereafter patterned to define a wiring pattern 4a (FIG. 1 and FIG. 2(e)) such that the altered portion 5 intersects the wiring pattern 4a. Electrodes 6 are subsequently provided on the wiring pattern 4a by any suitable known method. The patterning may be suitably effected by conventional photolothography.

In the thus prepared Josephson junction, the crystal orientations of the wiring pattern 4a on both sides of the altered region 5 are equal to each other. Preferably, the average crystal orientation of the altered region 5 is equal to the crystal orientation of the wiring pattern 4a on each side of the altered region 5.

In the foregoing embodiment, only one Josephson junction is described as formed on the substrate for sake of simplicity. It is without saying that any desired number of such junctions can be formed on a single substrate in the same manner as above. The method according to the present invention is effective in producing integrated Josephson junctions utilized for the application to SQUIDS.

The following example will further illustrate the present invention.

EXAMPLE 1

One surface of a single crystal MgO (100) substrate was coated with Au by vacuum deposition to form a protecting layer of Au having a thickness of about 100 nm. This was then disposed in a apparatus and was irradiated with a focused $Ga^+$ ion beam at 30 KeV focused ion beam . The beam with a diameter of 50 nm was scanned through a length of 10 μm for 40 seconds with a beam current of 1 pA so that there was formed an irradiated portion into which Ga was infiltrate. The width of the irradiated portion was about 130 nm. The Au layer was then removed by 450 eV $Ar^+$ ion milling. A $YBa_2Cu_3O_{7-x}$ was then deposited on the substrate by a pulse laser deposition method to form a superconductor layer having a thickness of 300 nm and having an altered portion above the irradiated portion. The YBaCuO layer was then patterned to form an H-shaped wiring pattern which had a length of 30 μm and a width of 5 μm and which was intersected by the altered portion. An electrode was applied to each of the four leg portions of the H-shaped wiring pattern to form a junction structure. When this structure was irradiated with a microwave at 65 K, Shapiro steps were observed, indicating that the structure was a Josephson junction.

Figure 3:
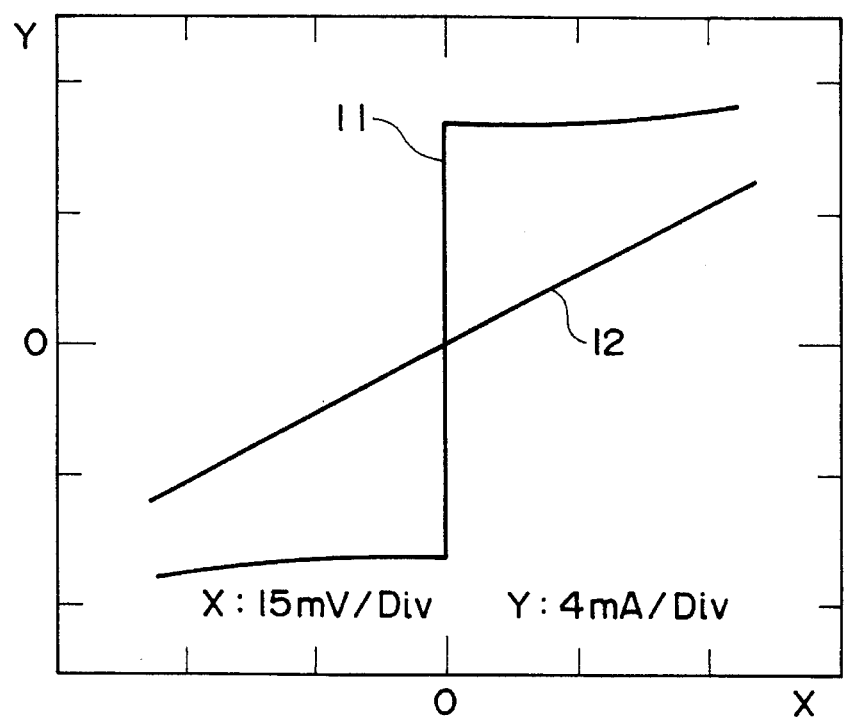
FIG. 3 is a graph showing current/voltage characteristics of the Josephson junction of this invention produced in Example 1.

FIG. 3 shows voltage-current characteristics of the above Josephson junction at 4.2 K without microwave irradiation (line 11) and with high power microwave was irradiated (line 12). The critical current (Ic), which is a current at a voltage of zero when no microwave power is applied, was 7 mA. It is known that the critical current is perfectly suppressed and the resistivity approaches normal resistance (Rn) when a sufficiently large microwave power is applied. In the case of FIG. 3, the normal resistance is about 8 ohms.

Figure 4:
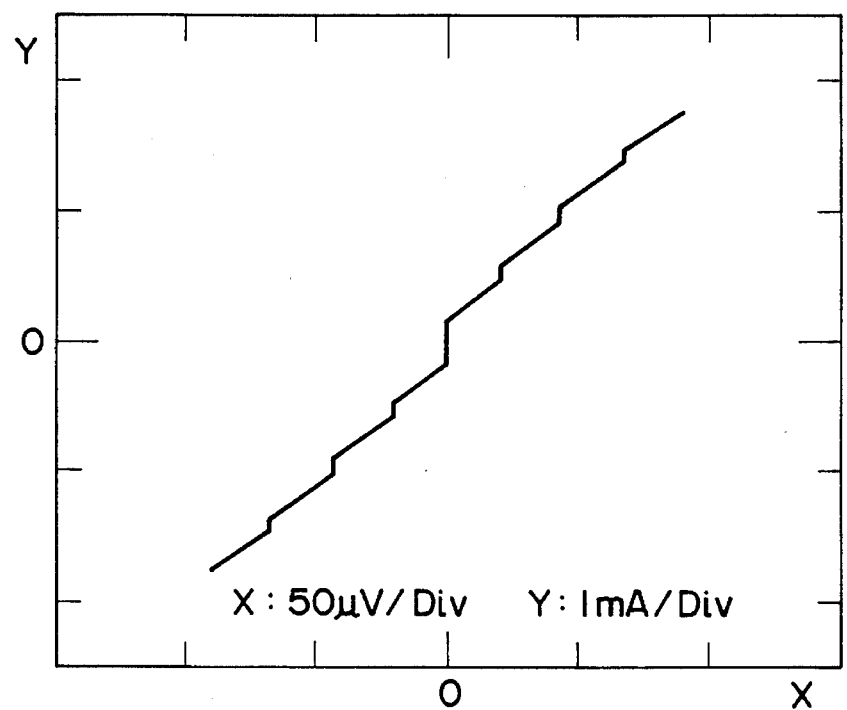
FIG. 4 is a diagram shown the Shapiro step characteristics of the Josephson junction produced in Example 1.

FIG. 4 shows Shapiro step characteristics of the above Jesophson junction measured at 4.2 K while irradiating with a strong microwave of 10.2 GHz. The $G^+$ ion beam was scanned twice through a length of 10 μm for 20 seconds with a beam current of 1 pA. From the results shown in FIG. 4, it will be appreciated that the Josephson junction exhibits excellent performance. The IcRn of this junction was found to be more than 50 mV. This indicates that a good tunnel barrier is formed. Similar procedures were repeated a number of times. Josephson junctions having large RnIc products were obtained with excellent reproducibility.

FIG. 5 shows temperature dependency of the superconducting critical current per unit area (critical current density (jc)) of the Josephson junctions. The curves 13 and 14 are for the samples with irradiation widths of 130 nm and 60 nm, respectively. The curve 15 is for the non-irradiated sample. From the results shown in FIG. 5, it will be appreciated that the current density (jc) decreases with an increase in irradiation width. The reason for this is considered to be because that portion of the YBaCuO layer above the irradiated region is altered and converted into a normal conductor so that there is formed an SNS (superconductor/normal metal/superconductor) structure. Namely, it is believed that the crystlinity of the portion of the MgO substrate irradiated with Ga ion beam is disturbed so that a stress or crystal disturbance is also caused in that portion of the YBaCuO layer above the irradiated portion of the MgO substrate. The Ga, which was implanted in the irradiated portion of the MgO substrate, is diffused into the YBaCuO layer during the formation of the YBaCuO layer which is performed at-a high temperature. The crystal disturbance and the Ga diffusion synergetically cause oxygen defficiency in that portion of the YBaCuO layer above the irradiated portion of the MgO substrate. Since the YBaCuO layer is C-axis oriented, the vertical direction of the junction plane of the plannar structure becomes a-b axis having a long coherent length. Further, the crystal structure and chemical composition of the tunnel layer are similar to those of the superconductor layer. For these reasons, a superconductive tunnel current is considered to flow.

We claim:

1. A Josephson junction comprising a substrate of a single crystal having a substantially flat surface with an area portion implanted with $Ga^+$ ions, a wiring pattern of an oxide superconductor formed on said flat surface of said substrate, and an altered region formed in said wiring pattern directly above said area portion, said altered region having a width of 300 nm or less and intersecting said wiring pattern, said wiring pattern having a crystal orientation which is the same on both sides of said altered region and said altered region having an average crystal orientation which is equal to the crystal orientation of said Wiring pattern on both sides of said altered region.

2. A Josephson junction according to claim 1, wherein said substrate is formed of a single crystal of an oxide selected from $MgO$, $SrTiO_3$, $NdGaO_3$, $LaAlO_3$, $LaGaO_3$ and mixed crystals thereof.

3. A Josephson junction according to claim 1, wherein said oxide superconductor is a YBaCuO superconductor.

4. A Josephson function according to claim 1 wherein said altered region differs from the remainder of said wiring pattern of oxide superconductor in that said altered region contains diffused $Ga^+$.

* * * * *

UNITED STATES PATENT AND TRADEMARK OFFICE
CERTIFICATE OF CORRECTION

PATENT NO. : 5,534,715
DATED : July 9, 1996
INVENTOR(S) : NEUMANN et al

It is certified that error appears in the above-indentified patent and that said Letters Patent is hereby corrected as shown below:

Col. 3, line 47, "photolothography" should read --photolithography--.

Col. 4, line 3, delete "focused ion beam";
　　line 22, delete "was" and "irradiated" should read --irradiation--;
　　line 31, "Jesophson" should read --Josephson--; and
　　line 59, "at-a" should read --at a--.

Col. 5, line 14, "Wiring" should read --wiring--.

Col. 4, line 2, before "apparatos" insert --focused ion beam--.

Signed and Sealed this

Tenth Day of June, 1997

Attest:

BRUCE LEHMAN

*Attesting Officer*　　*Commissioner of Patents and Trademarks*